US007639008B2

(12) United States Patent
Ookawa

(10) Patent No.: US 7,639,008 B2
(45) Date of Patent: Dec. 29, 2009

(54) SYSTEM, METHOD AND APPARATUS FOR IDENTIFYING ABNORMALITY IN MRI RF INPUT CIRCUITS BY COMBINATION MODE SWITCHING IN SINGLE MRI SEQUENCE SCAN

(75) Inventor: Masashi Ookawa, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/048,891

(22) Filed: Mar. 14, 2008

(65) Prior Publication Data
US 2008/0231269 A1   Sep. 25, 2008

(30) Foreign Application Priority Data
Mar. 19, 2007   (JP)   ............................. 2007-071280
Dec. 26, 2007   (JP)   ............................. 2007-334382

(51) Int. Cl.
*G01V 3/00*   (2006.01)
(52) U.S. Cl. ..................................... 324/307
(58) Field of Classification Search ......... 324/300–322; 600/410–435
See application file for complete search history.

(56) References Cited

U.S. PATENT DOCUMENTS 6,362,620 B1 *   3/2002   Debbins et al. ............. 324/309
6,377,044 B1 *   4/2002   Burl et al. .................. 324/307
6,500,122 B1 *   12/2002  Washburn et al. ........... 600/443
6,724,923 B2     4/2004   Ma et al.
6,972,565 B2 *   12/2005  Yokoi et al. ................ 324/307
7,259,559 B2     8/2007   Nabetani et al.
7,259,563 B2 *   8/2007   Nozaki ....................... 324/318
2006/0181278 A1   8/2006   Nozaki
2006/0214777 A1 *  9/2006   Schmitt ................. 340/310.11

FOREIGN PATENT DOCUMENTS

| CN | 1821804 | 8/2006 |
|----|---------|--------|
| JP | 5-261081 | 10/1993 |
| JP | 11-276452 | 10/1999 |
| JP | 2002-355233 | 12/2002 |
| JP | 2003-334177 | 11/2003 |
| JP | 2006-141444 | 6/2006 |
| JP | 2006-175058 | 7/2006 |

OTHER PUBLICATIONS

Office Action dated Sep. 25, 2009 in CN 2008100871238.

* cited by examiner

*Primary Examiner*—Brij B Shrivastav
*Assistant Examiner*—Dixomara Vargas
(74) *Attorney, Agent, or Firm*—Nixon & Vanderhye PC

(57) ABSTRACT

A real-time system changes a combination of coil elements and channel assignments for each echo by using a pulse sequence, and collects data without performing phase encoding. A host system then calculates a correlation value of data reconstructed for each channel and reference data. When the correlation value is smaller than a predetermined threshold value, the host system judges the coil element combination to be abnormal. The host system makes a level correction on the collected data and creates an alternative solution for the abnormal coil element combination, including a reduction of a number of channels.

25 Claims, 7 Drawing Sheets

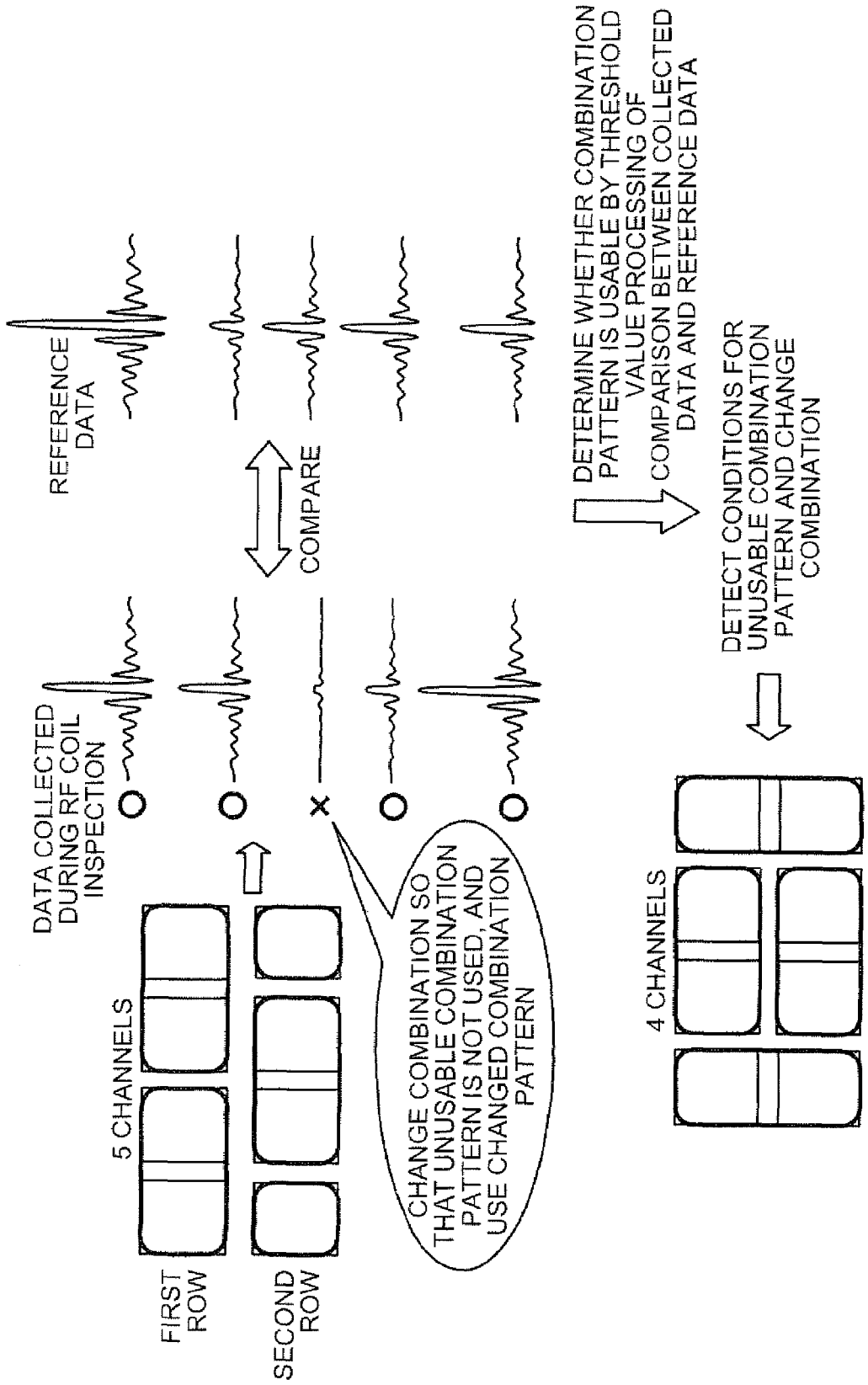

SYSTEM, METHOD AND APPARATUS FOR IDENTIFYING ABNORMALITY IN MRI RF INPUT CIRCUITS BY COMBINATION MODE SWITCHING IN SINGLE MRI SEQUENCE SCAN

CROSS-REFERENCE TO RELATED APPLICATIONS

This application is based upon and claims the benefit of priority from the prior Japanese Patent Application No. 2007-071280, filed on Mar. 19, 2007; and Japanese Patent Application No. 2007-334382, filed on Dec. 26, 2007, the entire contents of which are incorporated herein by reference.

BACKGROUND OF THE INVENTION

1. Field of the Invention

The present invention relates to a coil inspection technology for a magnetic resonance imaging (MRI) apparatus that can change a combination of coil elements for receiving a magnetic resonance (MR) signal and assign the combination of the coil elements to a channel.

2. Description of the Related Art

A magnetic resonance imaging performed by an MRI apparatus is an imaging method in which a nuclear spin of a patient placed within a static magnetic field is magnetically excited by a radio-frequency signal of a Larmor frequency, and an image is reconstructed from an MR signal generated in connection with the excitation.

In order to perform this imaging method, the MRI apparatus includes a static magnetic field magnet that generates the static magnetic field, and a mechanism that applies a gradient magnetic field pulse and a radio-frequency magnetic field pulse to the patient according to a predetermined pulse sequence. Among the pulses, the gradient magnetic field pulse is transmitted to the patient through a gradient magnetic field coil. The gradient magnetic field coil is disposed within a bore in the static magnetic field magnet and is connected to a gradient magnetic-field power source. Similarly, the radio-frequency magnetic-field pulse is transmitted to the patient through a radio-frequency coil for transmission. The radio-frequency coil for transmission is disposed within the bore in the static magnetic field magnet and is connected to a transmitter. On the other hand, a radio-frequency coil for reception is disposed near the patient to receive an MR signal that is composed of a radio-frequency signal and generated from the patient. The radio-frequency coil for transmission and the radio-frequency coil for reception can be combined into a single coil. However, in many instances, dedicated radio-frequency receiving coils for different diagnostic regions are used.

In other words, to acquire an image with high-sensitivity, the patient is imaged with a plurality of surface coils (array coils) as the radio-frequency receiving coils disposed in a region-of-interest of the patient. For example, an array coil consisting of quadrature detection (QD) surface coils arrayed in a body axis direction, such as that described in JP-A H5-261081 (KOKAI), is proposed as a spinal coil. The QD surface coil is a coil formed by disposing a loop-shaped surface coil and a figure-eight shaped surface coil in a superimposed manner. A signal-to-noise (S/N) ratio of the QD coil can be improved as compared to when the figure-eight shaped surface coil is not superimposed.

On the other hand, as described in JP-A 2003-334177 (KOKAI), when an overall abdominal area is imaged, ordinarily, a plurality of surface coils is disposed such as to surround the patient and receive a signal emitted from the overall abdominal area. As the surface coils, array coils consisting of a plurality of loop coils arrayed along a body surface are often used.

In recent years, an MRI apparatus has been developed that can change a combination of a plurality of coil elements and assign the coil element combination to a channel (refer to, for example, JP-R 2006-141444 (KOKAI). In this MRI apparatus, sensitivity distribution can be optimized for each region to be imaged as a result of the combination of coil elements being changed and the coil element combination being assigned to a channel.

However, in the MRI apparatus that can change the combination of coil elements and assign the coil element combination to a channel, an inspection of the radio-frequency receiving coils during installation and the like requires time and effort.

Namely, in order to inspect all coil elements and portions used when the coil elements are combined, imagings are required for each coil element combination, and the inspections are required for using collected pieces of data and images. Therefore, when a large number of coil elements are present, the inspection is required for several tens of thousands of combinations, thereby requiring a large amount of time.

SUMMARY OF THE INVENTION

According to one aspect of the present invention, a magnetic resonance imaging apparatus includes an applying unit that applies a gradient magnetic field and a radio-frequency pulse to a patient placed within a static magnetic field; a radio-frequency coil having a plurality of coil elements each of which detects a magnetic resonance signal emitted from the patient depending on the application of the gradient magnetic field and the radio-frequency pulse; a plurality of receivers each of which receives a magnetic resonance signal and processes the received magnetic resonance signal; a signal selecting circuit that combines magnetic resonance signals from the plurality of the coil elements and inputs a combined magnetic resonance signal to each of the plurality of the receivers, the signal selecting circuit having a plurality of composite combination modes for the magnetic resonance signals; an image sequence controlling unit that switches among a plurality of combination modes during performing a single imaging sequence or a plurality of imaging sequences, and collects the magnetic resonance signals for each combination mode; and an abnormality identifying unit that identifies an abnormality in at least any of the combination mode, the coil element, the receiver, and a combining unit combining the magnetic resonance signals.

According to another aspect of the present invention, a magnetic-resonance imaging maintenance apparatus includes an acquiring unit that acquires magnetic resonance signals for each combination mode collected by a magnetic resonance imaging apparatus by switching among a plurality of combination modes during performing an imaging sequence or a plurality of imaging sequences, the magnetic resonance imaging apparatus having a plurality of composite combination modes of magnetic resonance signals detected by a plurality of coil elements; and an abnormality identifying unit that identifies an abnormality in at least any of the combination mode, the coil element, the receiver, and a combining unit combining the magnetic resonance signals, based on the magnetic resonance signals for each combination mode acquired by the acquiring unit.

According to still another aspect of the present invention, a magnetic-resonance imaging maintenance system includes a magnetic resonance imaging apparatus including n applying unit that applies a gradient magnetic field and a radio-frequency pulse to a patient placed within a static magnetic field, a radio-frequency coil having a plurality of coil elements each of which detects a magnetic resonance signal emitted from the patient depending on the application of the gradient magnetic field and the radio-frequency pulse, a plurality of receivers each of which receives a magnetic resonance signal and processes the received magnetic resonance signal, a signal selecting circuit that combines magnetic resonance signals from the plurality of coil elements and inputs a combined magnetic resonance signal to each of the plurality of the receivers, the signal selecting circuit having a plurality of composite combination modes for the magnetic resonance signals, an image sequence controlling unit that switches among a plurality of combination modes during performing a single imaging sequence or a plurality of imaging sequences, and collects the magnetic resonance signals for each combination mode; and a magnetic-resonance imaging maintenance apparatus including an acquiring unit that acquires magnetic resonance signals for each combination mode collected by the magnetic resonance imaging apparatus by switching among a plurality of combination modes, and an abnormality identifying unit that identifies an abnormality in at least any of the combination mode, the coil element, the receiver, and a combining unit combining the magnetic resonance signals, based on the magnetic resonance signals for each combination mode acquired by the acquiring unit.

According to still another aspect of the present invention, a magnetic resonance imaging method includes acquiring magnetic resonance signals for each combination mode collected by a magnetic resonance imaging apparatus by switching among a plurality of combination modes during performing an imaging sequence or a plurality of imaging sequences, the magnetic resonance imaging apparatus having a plurality of composite combination modes of magnetic resonance signals detected by a plurality of coil elements; and identifying an abnormality in at least any of the combination mode, the coil element, the receiver, and a combining unit combining the magnetic resonance signals, based on the magnetic resonance signals for the plurality of the combination modes.

BRIEF DESCRIPTION OF THE DRAWINGS

FIG. 9 is an explanatory diagram explaining an automatic creation of an alternative solution for an abnormal coil element combination.

DETAILED DESCRIPTION OF THE INVENTION

Exemplary embodiments of a magnetic resonance imaging apparatus, a magnetic-resonance imaging maintenance apparatus, a magnetic-resonance imaging maintenance system, and a magnetic-resonance apparatus inspecting method according to the present invention are below described with reference to the attached drawings.

First, a radio-frequency (RF) coil (high frequency coil) inspection method according to an embodiment will be described. In the RF coil Inspection method according to the embodiment, a combination of coil elements and channel assignations are specified for each echo used in a pulse sequence. Imaging for RF coil inspection is performed without performing phase encoding.

Figure 1:
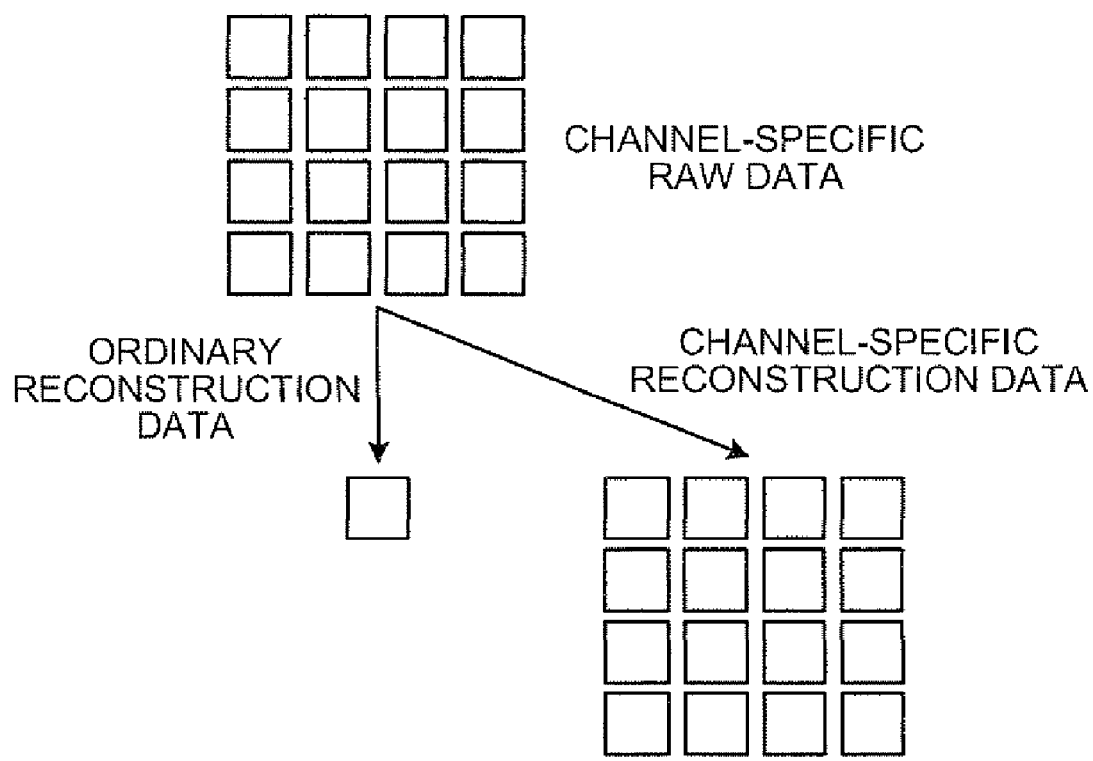
FIG. 1 is an explanatory diagram explaining a use of channel-specific reconstruction data.

As shown in FIG. 1, each coil element combination is inspected through comparison of channel-specific reconstruction data and reference data that is prepared in advance under same imaging conditions as those under which the channel-specific reconstruction data is obtained, instead of reconstruction and composition of a plurality of channel-specific raw data.

A phantom generating sufficient signals and range to cover sensitivity of the RF coil is used for imaging. In order to accurately reproduce imaging when the reference data is collected, a jig that constantly fixes the RE coil and the phantom is used. Reference data for pre-shipment, for installation, for inspection, for failure, and the like are prepared in advance.

In this way, in the RF coil inspection method according to the embodiment, the coil element combination and channel assignation are specified for each echo. The imaging for RF coil inspection is performed without performing the phase encoding. Each element coil combination is inspected through the comparison of the channel-specific reconstruction data with the reference data.

Therefore, the coil element combination can be more efficiently inspected compared to when the inspection is performed using an ordinary image, because the phase encoding is not performed. A large number of coil element combinations can be inspected within a short amount of time. The coil element combination can be more efficiently inspected using each of the channel-specific reconstruction data compared to when the channel-specific reconstruction data are combined and inspected to perform inspection.

Figure 2:
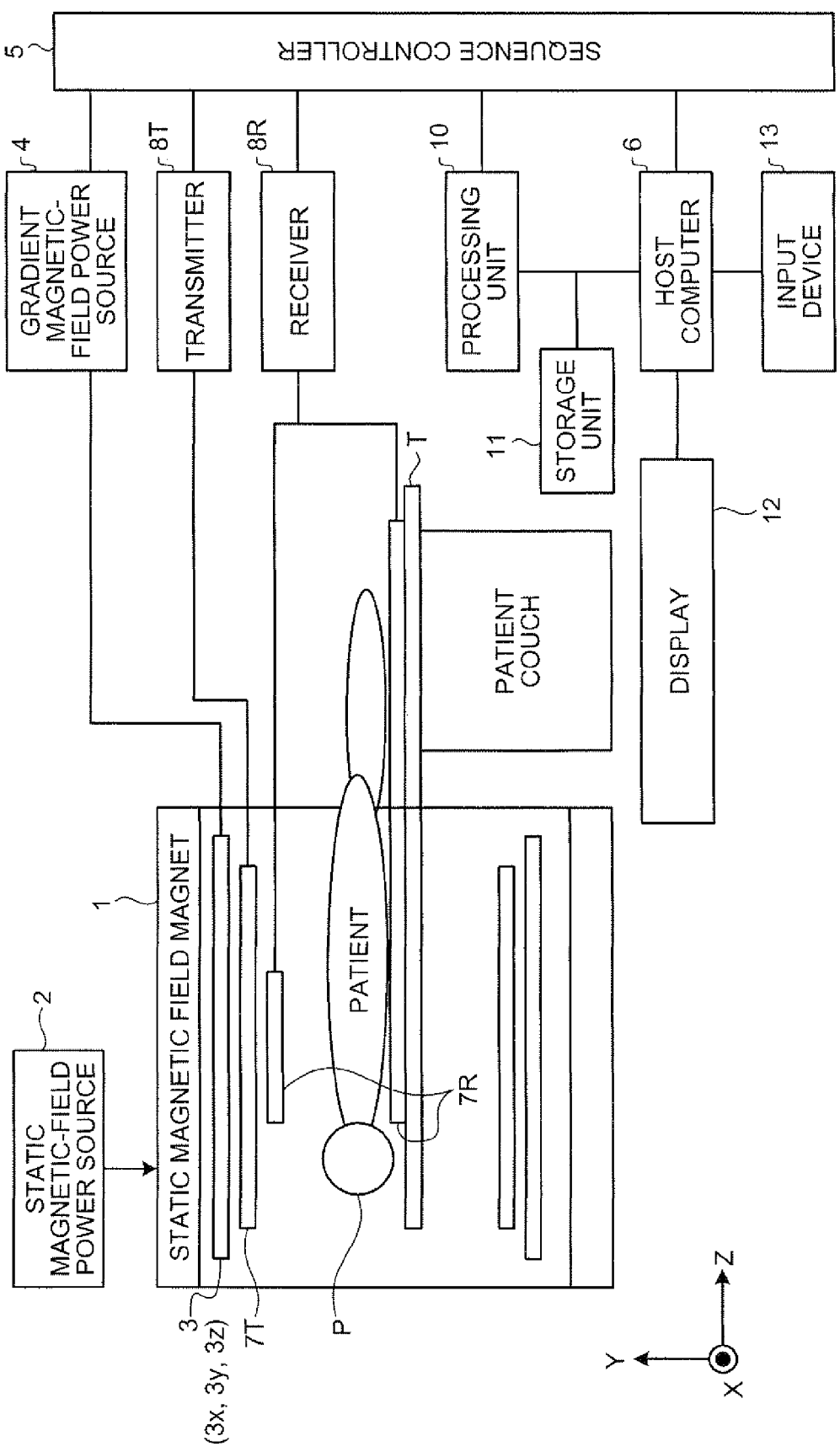
FIG. 2 is a functional block diagram of a configuration of an MRI apparatus according to an embodiment.

Next, a configuration of an MRI apparatus according to the embodiment will be described. FIG. 2 is a functional block diagram of the configuration of the MRI apparatus according to the embodiment. The MRI apparatus includes a patient couch, a static magnetic-field generating unit, a gradient magnetic-field generating unit, a transmitting and receiving unit, and a controlling and processing unit. A patient P is placed on the patient couch. The static magnetic-field generating unit generates a static magnetic field. The gradient magnetic-field generating unit is used to add position information to the static magnetic field. The transmitting and receiving unit transmits and receives radio-frequency signals. The controlling and processing unit takes charge of controlling the overall system and image reconstruction.

The static magnetic-field generating unit includes a superconducting type static magnetic field magnet 1 and a static magnetic-field power source 2. The static magnetic-field power source 2 supplies the static magnetic field magnet 1 with an electrical current. The static magnetic-field generating unit generates a static magnetic field H0 in an axial direction (Z axis direction) of a cylindrical opening section (a diagnostic space) in which the patient P is placed. The static magnetic field magnet 1 includes a shim coil (not shown). A top board T of the patient couch on which the patient P is placed can be inserted into and escaped from the opening section of the static magnetic field magnet 1.

The gradient magnetic-field generating unit includes a gradient magnetic-field coil unit 3 incorporated into the static magnetic field magnet 1. The gradient magnetic-field coil unit 3 includes three groups (kinds) of x, y, and z coils, 3x to 3z for generating the gradient magnetic field in an X axis direction, a Y axis direction, and the Z axis direction, respectively. The X axis direction, the Y axis direction, and the Z axis direction are perpendicular to each other. The gradient magnetic-field generating unit also includes a gradient magnetic-field power source 4 that supplies the x, y, and z coils 3x to 3z with an electrical current. The gradient magnetic-field power source 4 supplies the x, y, and z coils 3x to 3z with a pulse current to generate the gradient magnetic field, under control of a sequence controller, described hereafter.

As a result of the pulse current supplied to the x, y, and z coils 3x to 3z from the gradient magnetic-field cower source 4 being controlled, the gradient magnetic fields in directions of three physical axes (X axis, Y axis, and Z axis) are combined. Due to this, a logical axial direction composed of mutually perpendicular slicing direction gradient magnetic-field GS, phase encoding direction gradient magnetic-field GE, and readout direction (frequency encoding direction) gradient magnetic-field CR can be arbitrarily set and changed. Each gradient magnetic field in the slicing direction, the phase encoding direction, and the readout direction are superimposed with the static magnetic field H0.

The transmitting and receiving unit includes a radio-frequency transmitting coil 7T, a radio-frequency receiving coil 7R, a transmitter 8T, and a receiver 8R. The radio-frequency transmitting coil 7T and the radio-frequency receiving coil 7R are disposed near the patient P in an imaging space within the static magnetic field magnet 1. The transmitter 8T and the receiver 8R are respectively connected to the radio-frequency transmitting coil 7T and the radio-frequency receiving coil 7R. The transmitter 8T and the receiver 8R operate under the control of a sequence controller 5, described hereafter. As a result of the operation, the transmitter 8T supplies RF current pulse of a Larmor frequency to the radio-frequency transmitting coil 7T to excite magnetic nuclear resonance. The receiver 8R receives the magnetic resonance (MR) signal (radio-frequency signal) received by the radio-frequency receiving coil 7R. The receiver 8R performs various signal processing operations, such as pre-amplification, intermediate frequency conversion, phase detection, low frequency amplification, and filtering, on the MR signal. The receiver 8R then performs analog-to-digital (A/D) conversion and generates digital data (raw data) of the MR signal.

Further, the controlling and processing unit includes the sequence controller (also referred to as a sequencer) 5, a host computer 6, a processing unit 10, a storage unit 11, a display 12, and an input device 13. The host computer 6 functions to provide the sequence controller 5 with pulse sequence information and oversees the operation of the overall apparatus, based on stored software procedures (not shown).

The sequence controller 5 includes a central processing unit (CPU) and a memory. The sequence controller 5 stores the pulse sequence information sent from the host computer 6 and controls operations of the gradient magnetic-field power source 4, the transmitter 8T, and the receiver 8R in accordance with the information. The sequence controller 5 also tempo-rarily receives input of the MR signal digital data outputted from the receiver 8R, and transfers the MR signal digital data to the processing unit 10. Here, the pulse sequence information refers to all pieces of information required to operate the gradient magnetic-field power source 4, the transmitter 8T, and the receiver 8R in accordance with a series of pulse sequences. The pulse sequence information includes, for example, pieces of information related to a strength of the pulse current applied to the x, y, and z coils 3x to 3z, application duration, application timing, and the like.

The processing unit 10 receives an input of the digital data outputted from the receiver 8R, through the sequence controller 5. The processing unit 10 disposes the digital data in a k space (also referred to as a Fourier space or a frequency space) that is an internal memory of the processing unit 10. The processing unit 10 performs a two-dimensional or a three-dimensional Fourier transform operation on each group of data and reconstructs real-space image data. The processing unit 10 can also perform a composite processing operation and a difference calculation processing operation on data related to the image, as required. The composite processing operation includes processing in which data is added for each pixel, maximum intensity projection (MIP) processing, and the like.

In addition to holding reconstructed image data, the storage unit 11 can hold image data on which the above-described composite processing operation and difference calculation processing operation have been performed. The display 12 is, for example, used to display a reconstructed image. An operator can enter desired parameter information, scanning conditions, pulse sequences, information related to image composition and difference calculation, and the like into the host computer C, via the input device 13.

The radio-frequency receiving coil 7R for reception is actually formed from a plurality of coil elements. The MR signal received by each of the coil elements is sent to the receiver SR. The receiver 8R has four reception channels. Each reception channel is supplied with the MR signal from a designated combination of coil elements. Therefore, data of a digital quantity corresponding to the MR signal is outputted from each reception channel.

The pieces of data collected by each reception channel are transmitted to the processing unit 10, via the sequence controller 5. The processing unit 10 reconstructs the received collected data and generates image data in a time space. During the reconstruction, a reconstruction processing operation is performed on the pieces of data collected from each coil element in the radio-frequency receiving coil 7R respectively for each reception channel. The pieces of reconstructed data are combined into a single image through a calculation of a square-root of a sum of squares.

Figure 3:
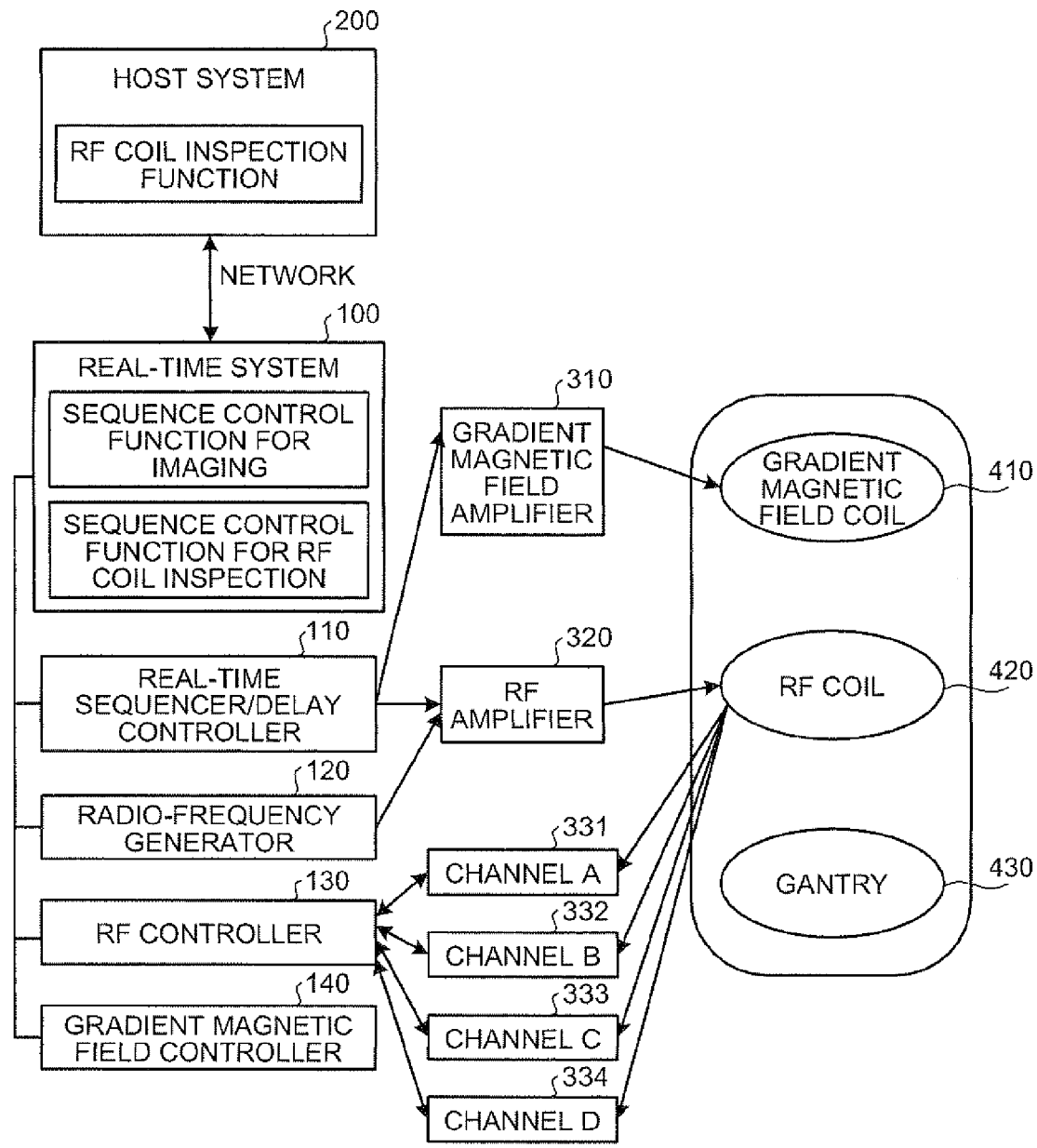
FIG. 3 is a diagram illustrating a configuration of an MRI apparatus related to an RF coil inspection according to the embodiment.

Next, a configuration of the MRI apparatus related to the RF coil inspection according to the embodiment will be described. FIG. 3 is a diagram illustrating the configuration of the MRI apparatus related to the RF coil inspection according to the embodiment. In the configuration related to the RF coil inspection according to the embodiment, the MRI apparatus includes a real-time system 100, a host system 200, a gradient magnetic field amplifier 310, an RF amplifier 320, a channel A 331 to a channel D 334, a gradient magnetic field coil 410, an RF coil 420, and a gantry 430.

The real-time system 100 controls the MRI apparatus at real time and includes a real-time sequencer/delay controller 110, a radio-frequency generator 120, an RF controller 130, and a gradient magnetic field controller 140.

The real-time sequencer/delay controller 110 is a controlling device what performs sequence control. The radio-frequency generator 120 generates a radio-frequency applied by the RF coil 420. The RF controller 130 controls the channel A 331 to channel D 334 and inputs the MR signal generated in the RF coil 420. The gradient magnetic field controller 140 controls gradient magnetic field generation.

The real-time system 100 has a sequence control function for imaging and a sequence control function for RF coil inspection. A sequence control for imaging is performed when a patient is imaged. A sequence control for RF coil inspection is performed when the RF coil 420 is inspected. The pulse sequence used when the RF coil 420 is inspected will be described hereafter.

The real-time system 100 collects the MR signals inputted from the RF controller 130 as raw data and transmits the collected raw data to the host system 200, via a network.

The host system 200 receives the raw data from the real-time system 100 and generates the reconstruction data. The host system 200 performs image generation, image display, and the like using the generated reconstruction data. The host system 200 corresponds to the host computer 6, the processing unit 10, the storage unit 11, the display 12, and the input device 13 shown in FIG. 2.

The host system 200 also provides a RF coil inspection function for inspecting the RF coil 420. In other words, when the host system 200 receives the raw data collected for the RF coil 420 inspection from the real-time system 100, the host system 200 reconstructs the received raw data for each channel, and inspects the RF coil 420 by comparing the reconstructed raw data with the reference data.

The gradient magnetic field amplifier 310 amplifies a gradient magnetic-field control signal from the real-time sequencer/delay controller 110 and outputs the amplified signal to the gradient magnetic field coil 410. The RF amplifier 320 amplifies the radio-frequency generated by the radio-frequency generator 120 based on the signal from the real-time sequencer/delay controller 110 and outputs the amplified radio-frequency to the RF coil 420.

The channel A 331 to channel D 334 are used by the RF controller 130 to input the MR signals generated in the RF coil 420. Each channel receives a signal from each of the coil elements configuring the radio-frequency receiving coil of the RE coil 420.

Figure 4:
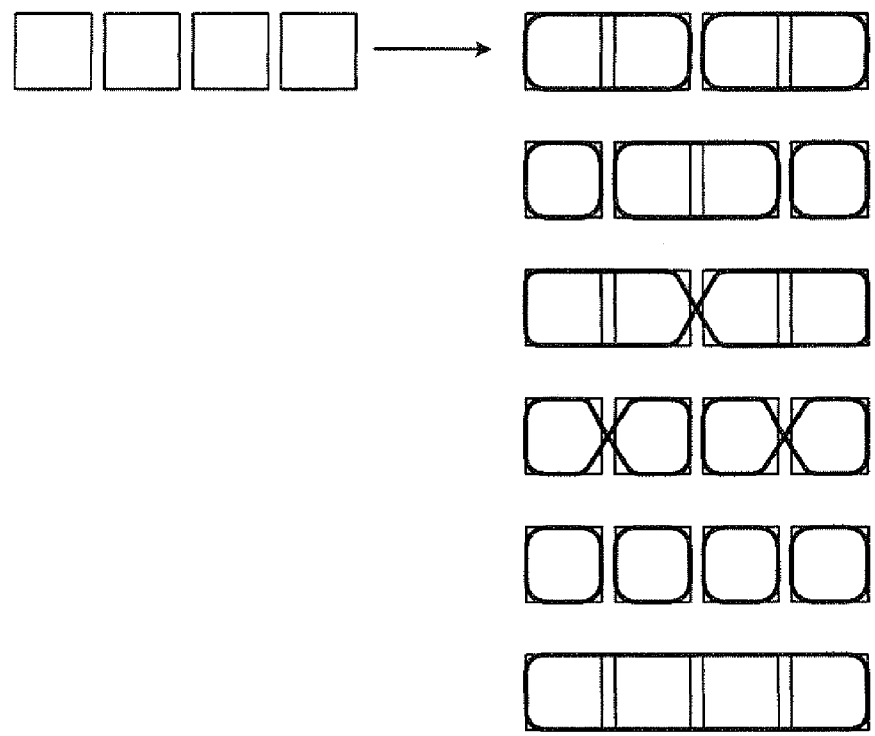
FIG. 4 is a diagram illustrating examples of coil element combinations when four coil elements are present.

FIG. 4 is a diagram illustrating examples of coil element combinations when four coil elements are present. As shown in FIG. 4, a single radio-frequency receiving coil is configured by a combination of an arbitrary number of coil elements. A single coil element combination is assigned to a single channel for each echo by using the pulse sequence.

The gradient magnetic field coil 410 generates the gradient magnetic field and corresponds to the gradient magnetic-field coil unit 3 shown in FIG. 2. The RF coil 420 includes the radio-frequency transmitting coil and the radio-frequency receiving coil and corresponds to the radio-frequency transmitting coil 7T and the radio-frequency receiving coil 7R shown in FIG. 2. In other words, the radio-frequency receiving coil 7R includes a plurality of coil elements.

The gantry 430 includes the gradient magnetic field coil 410, the RE coil 420, and the like, and into which the patient couch and the patient are inserted.

Figure 5:
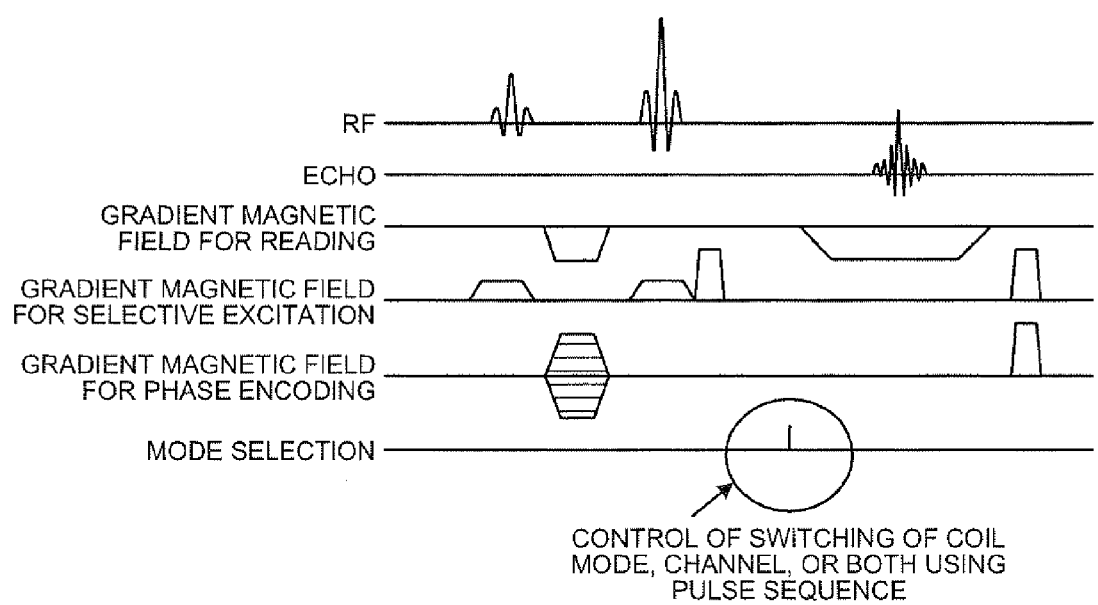
FIG. 5 is an explanatory diagram explaining a pulse sequence used by the MRI apparatus according to the embodiment.

Next, the pulse sequence used by the MRI apparatus according to the embodiment will be described. FIG. 5 is a diagram illustrating an example of the pulse sequence used by the MRI apparatus according to the embodiment. The MRI apparatus according to the embodiment applies a RF pulse, a gradient magnetic field pulse for readout, a gradient magnetic field pulse for selective excitation, and a gradient magnetic field pulse for phase encoding, by using the pulse sequence, which indicates a pulse sequence for a single echo (a single shot), shown in FIG. 5. The MRI apparatus then collects echo signals as the MR signals.

However, when the RF coil 420 inspection is performed, the MRI apparatus according to the embodiment switches coil mode and channel assignations at a timing indicated by mode selection shown in FIG. 5, without performing phase encoding. The coil mode is the coil element combination and is also referred to as combination mode.

When the RF coil 420 inspection is performed as described above, the MRI apparatus can efficiently collect data generated through various coil element combinations, without performing phase encoding, by switching the coil element combination and channel assignations at the mode selection timing for each echo, by using the pulse sequence. The mode selection timing shown in FIG. 5 can be any timing within the pulse sequence. The coil elements are combined by a signal selecting circuit having a plurality of combination modes. The MRI apparatus can collect data in an imaging sequence or a plurality of imaging sequences, if it can switch the coil element combination and channel assignations for each echo by using the pulse sequence.

Figure 6:
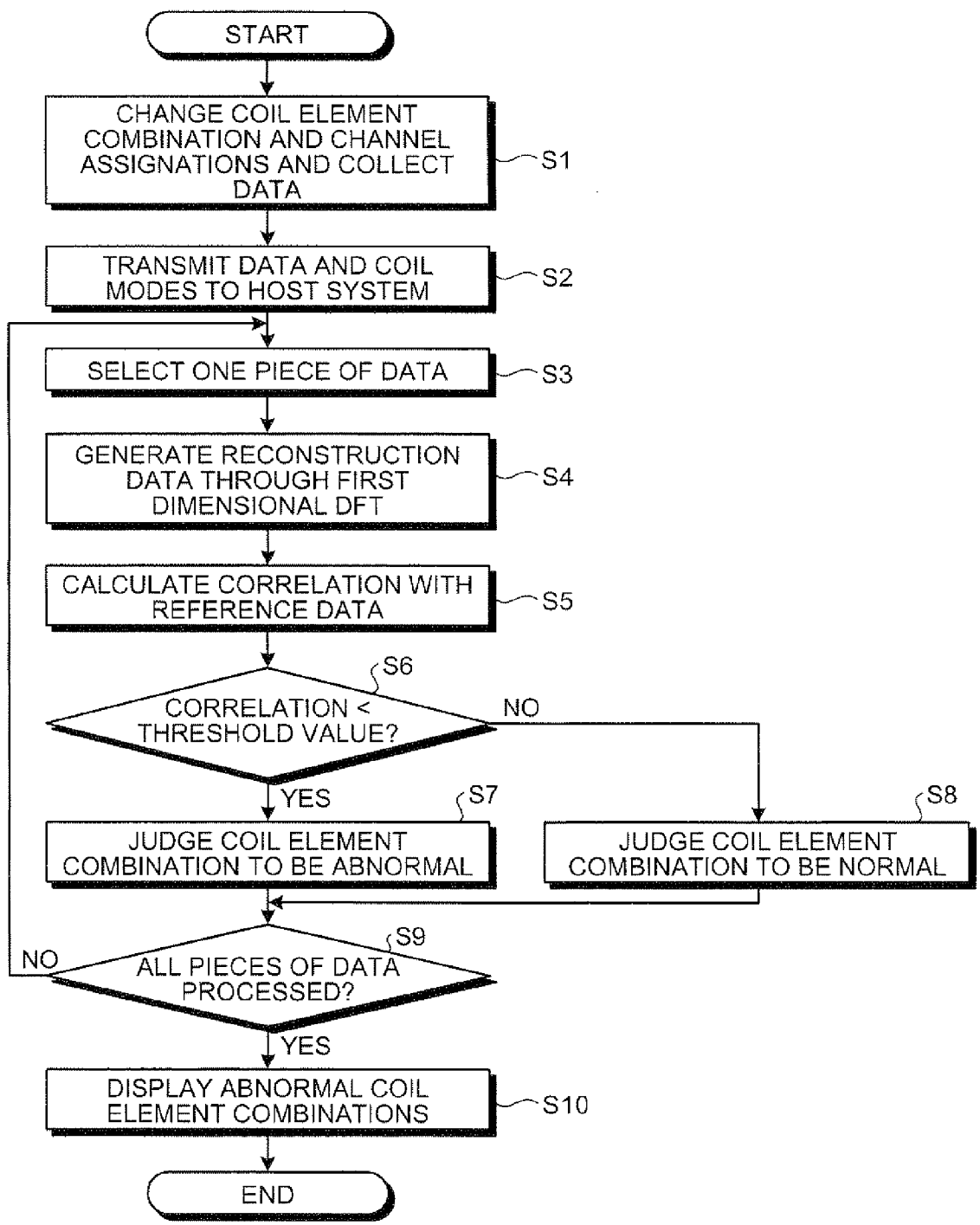
FIG. 6 is a flowchart of processing procedures in an RF coil inspection processing performed by the MRI apparatus according to the embodiment.

Next, processing procedures of inspection processing in a RF coil 420 performed by the MRI apparatus according to the embodiment will be described. FIG. 6 is a flowchart of the processing procedures of inspection processing in the RF coil 420 performed by the MRI apparatus according to the embodiment.

As shown in FIG. 6, in the inspection processing, the real-time system 100 changes the coil element combination and channel assignations for each echo, by using the pulse sequence, and collects data (Step S1). The real-time system 100 transmits the collected data and coil modes to the host system 200 (Step S2).

The host system 200 compares the data of each coil mode with the reference data and identifies an abnormal coil mode, that is an abnormal combination of coil elements. Specifically, the host system 200 selects a single piece of data (Step S3), and then generates the reconstruction data of complex or absolute values through one-dimensional discrete Fourier transform (DFT) (Step S4). The host system 200 calculates a correlation regarding signal strength between the selected data and the reference data (Step S5). The host system 200 then judges whether a correlation value is smaller than a predetermined threshold value (Step S6). When the correlation value is judged to be smaller than the predetermined threshold value, the host system 200 judges that the coil mode corresponding to the data is abnormal (Step S7). When the correlation value is not judged to be smaller than the predetermined threshold value, the host system 200 judges that the coil mode corresponding to data is normal (Step S8).

The host system 200 then judges whether processing of all data is completed (Step S9). When unprocessed data is present, the host system 200 returns to Step S3 and processes next data. When the processing of all data is completed, the host system 200 displays the abnormal coil element combinations (Step S10).

The abnormal coil mode can be identified in this way, through the comparison of the correlation value between the channel-specific reconstruction data and the reference data with the predetermined threshold value. Here, the correlation is related to distribution of signal strength, therefore, the correlation value is calculated by correlation based on a discrete correlation proposition using fast Fourier transform (FTT).

Here, the correlation value between the channel-specific data and the reference data is calculated. However, the abnormal coil mode can be identified through the comparison with the reference data using other methods. For example, a threshold value processing for strength distribution can be performed. Alternatively, a threshold value processing performed on the raw data instead of the reconstruction data can be performed to identify an abnormal coil mode. Moreover, the raw data and the reconstruction data can be displayed and a user can select whether the coil mode is normal.

As described above, according to the embodiment, when the RF coil 420 is inspected, the real-time system 100 changes the coil element combination and the channel assignments for each echo by using the pulse sequence, and collects data without performing the phase encoding. The host system 200 then calculates the correlation value between the channel-specific reconstruction data and the reference data. When the correlation value is smaller than the predetermined threshold value, the host system 200 judges the coil element combination is abnormal. Therefore, the data for a large number of coil element combinations can be efficiently collected, and whether the coil element combinations are normal can be efficiently judged. The RF coil 420 can be inspected under a short amount of time during installation and the like.

According to the embodiment, collection of the data without performing phase encoding is described. However, the phase encoding can be performed for a number of times less than that during an ordinary imaging operation. A two-dimensional FFT (2D-FFT) can be performed, thereby comparing the data with the reference data. As a result of the phase encoding being performed a plural number of times, abnormality detection can be performed over a more spatial spread.

According to the embodiment, when the echo signal is generated through application of the RF pulse is described, however, the present invention is not limited thereto. The present invention can be applied to the same technique when the RF coil 420 is inspected by using a simulated signal of the echo signal.

According to the embodiment, when the abnormal coil element combination is identified is described. However, an abnormal coil element, an abnormal channel, an abnormal signal selecting circuit, and the like can be identified from information on the abnormal coil element combination. For example, when data acquired from a single coil element is abnormal, the coil element can be identified as being abnormal. When data acquired from a certain channel is always abnormal, the channel can be identified as being abnormal. When data of a combination of two normal coil elements is abnormal, the signal selecting circuit combining the two coil elements can be identified as being abnormal.

Figure 7:
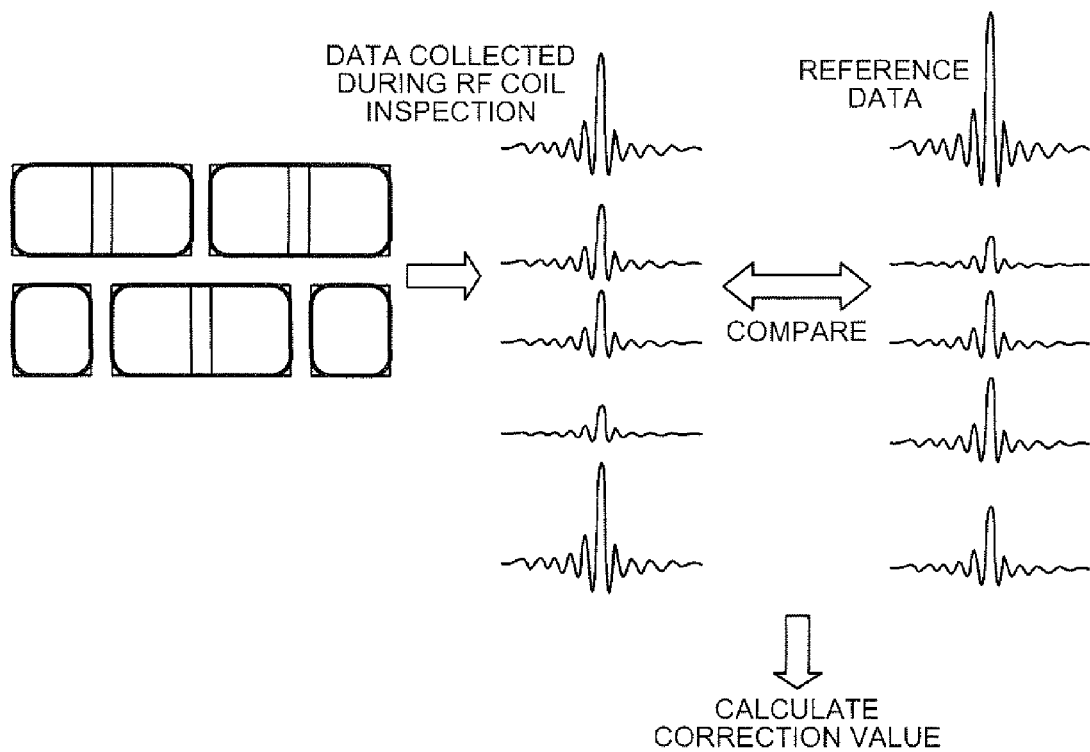
FIG. 7 is an explanatory diagram explaining an automatic correction of collected data.

According to the embodiment, when the abnormal coil element combination is identified is described. However, in addition to the abnormal coil element combination being identified, the collected data can be automatically corrected when a degree of abnormality is small. FIG. 7 is an explanatory diagram explaining an automatic correction (level correction) of the collected data. As shown in FIG. 7, the host system 200 compares the data collected during the RF coil inspection with the reference data and calculates a correction value. The host system 200 then stores the calculated correction value and the information on the coil element combination in a table. The host system 200 corrects using the correction value when the data collected from the patient is reconstructed.

Figure 8:
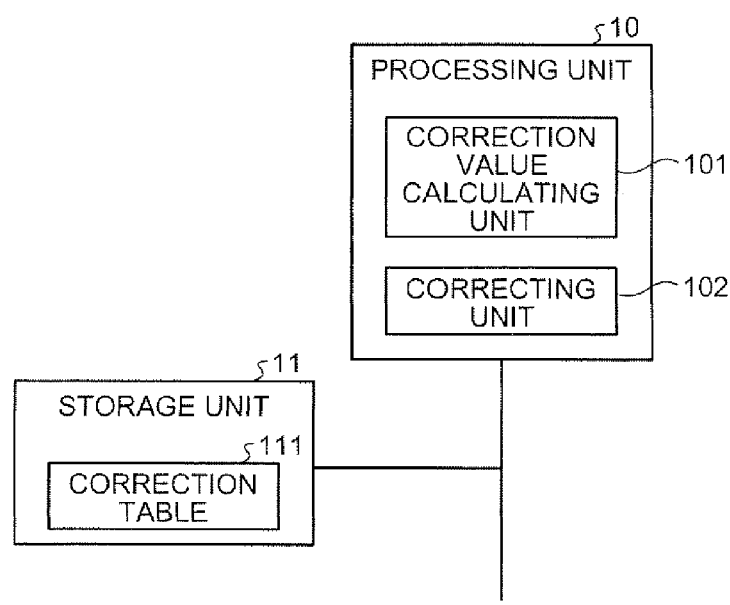
FIG. 8 is a block diagram of a functional configuration related to the automatic correction of the collected data.

Specifically, as shown in FIG. 8, a correction table 111 storing correction values and the information on the coil element combination is provided in the storage unit 11. A correction value calculating unit 101 calculating the correction values and a correcting unit 102 are provided in the processing unit 10. The correcting unit 102 corrects using the correction table 111 when the data collected from the patient is reconstructed. As a result of the correction using the correction table 111 when the data collected from the patient is reconstructed, image accuracy can be enhanced.

According to the embodiment, when the abnormal coil element combination is identified is described. However, in addition to the abnormal coil element combination being identified, an alternative solution for the abnormal coil element combination can be automatically created as well. FIG. 9 is an explanatory diagram explaining the automatic creation of the alternative solution for the abnormal coil element combination. In FIG. 9, for example, when any of coil element combinations in a second row is abnormal and no coil element in the second row is used, image quality significantly deteriorates. Therefore, the host system 200 automatically creates an alternative solution in which coil element combinations are changed and notifies the user of the changes. When creating an alternative solution, in addition to an alternative solution for a same number of channels, an alternative solution in which the number of channels is reduced is also created. FIG. 9 shows when an alternative solution is created in which five channels are reduced to four channels.

According to the embodiment, when the abnormal coil element combination is identified is described. However, an imaging plan that uses the identified abnormal coil element combination can be further identified, and a warning can be displayed when the identified imaging plan is used and the like. An alternative imaging plan can be found and displayed, as well. In this manner, warnings and the like being displayed at an imaging plan level, rather than a coil element combination level, even a general user can correspond to an abnormality of a coil element combination. The identification of the imaging plan through the abnormal coil element combination can be performed by storing coil element combinations in association with each imaging plan. The alternative imaging plan can also be retrieved by storing an alternative imaging plan in association with each imaging plan.

According to the embodiment, when the host system 200 of the MRI apparatus receives the raw data and the information related to the corresponding coil element combination from the real-time system 100, and identifies the abnormal coil element combination is described. However, the present invention is not limited thereto. A same technique can be applied when the host system 200 transmits the raw data and the information on the corresponding coil element combination to a remote maintenance apparatus provided in a maintenance center or the like, via a network such as a local area network (LAN) or a wide area network (WAN), and the remote maintenance apparatus identifies the abnormal coil element combination. As a result of the remote maintenance apparatus collecting information via the network and identifying the abnormality, a level of maintenance service can be enhanced.

According to the embodiment, when an abnormality in the coil element combination is detected is described. However, another abnormality can be detected using the collected data. For example, an abnormality in the channel, a gradient magnetic field for readout, and the like can be identified through detection of a spike-shaped signal in the raw data of all channels, a spike-shaped signal in the raw data of only some channels, a constant noise generated in a readout direction of the reconstructed data, and the like.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A magnetic resonance imaging apparatus comprising:
an applying unit that applies an imaging sequence of gradient magnetic fields and radio-frequency pulses to a patient placed within a static magnetic field;
a radio-frequency coil having a plurality of coil elements each of which detects magnetic resonance signals emitted from the patient during said imaging sequence depending on the application of the gradient magnetic fields and the radio-frequency pulses;
a plurality of receivers each of which receives magnetic resonance signals and processes the received magnetic resonance signals;
a signal selecting circuit that combines magnetic resonance signals from the plurality of coil elements and inputs a combined magnetic resonance signal to each of the plurality of receivers, the signal selecting circuit having a plurality of composite combination modes for the magnetic resonance signals;
an image sequence controlling unit that (a) switches among a plurality of combination modes during a single said imaging sequence, and (b) collects the magnetic resonance signals for each combination mode; and
an abnormality identifying unit that, based on said collected magnetic resonance signals, identifies an abnormality in at least any of (a) the combination mode, (b) the coil element, (c) the receiver, and (d) a combining unit combining the magnetic resonance signals.

2. The apparatus according to claim 1, further comprising:
a correction value calculating unit that calculates a correction value of a magnetic resonance signal for a combination mode identified as being abnormal, when an abnormality of the combination mode is identified by the abnormality identifying unit; and
a correcting unit that corrects the magnetic resonance signal detected by the radio-frequency coil based on the correction value calculated by the correction value calculating unit.

3. The apparatus according to claim 2, wherein
the correction value calculating unit stores the calculated correction value and the combination mode in a correction value storage unit; and
the correcting unit reads the correction value from the correction value storage unit and corrects the magnetic resonance signal detected by the radio-frequency coil.

4. The apparatus according to claim 2, further comprising:
an alternative mode creating unit that creates an alternative combination mode replacing the combination mode identified as being abnormal by the abnormality identifying unit, the alternative combination mode including a case where a number of channels is reduced.

5. The apparatus according to claim 4, wherein the abnormality identifying unit identifies an abnormal combination mode by:
reconstructing for each channel the magnetic resonance signals collected in the combination mode which is switched by the image sequence controlling unit, and
comparing respectively a magnetic resonance signal reconstructed for each channel with a reference.

6. The apparatus according to claim 4, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

7. The apparatus according to claim 5, further comprising:
an abnormal imaging-plan identifying unit that identifies an imaging plan using the abnormal combination mode identified by the abnormality identifying unit; and
a warning outputting unit that outputs a warning for the imaging plan identified by the abnormal imaging-plan identifying unit.

8. The apparatus according to claim 2, wherein the abnormality identifying unit identifies an abnormal combination mode by:
reconstructing for each channel the magnetic resonance signals collected in the combination mode which is switched by the image sequence controlling unit, and
comparing respectively a magnetic resonance signal reconstructed for each channel with a reference.

9. The apparatus according to claim 8, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

10. The apparatus according to claim 2, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

11. The apparatus according to claim 2, further comprising:
an abnormal imaging-plan identifying unit that identifies an imaging plan using the abnormal combination mode identified by the abnormality identifying unit; and
a warning outputting unit that outputs a warning for the imaging plan identified by the abnormal imaging-plan identifying unit.

12. The apparatus according to claim 1, further comprising:
an alternative mode creating unit that creates an alternative combination mode replacing the combination mode identified as being abnormal by the abnormality identifying unit, the alternative combination mode including a case where a number of channels is reduced.

13. The apparatus according to claim 12, wherein the abnormality identifying unit identifies an abnormal combination mode by:
reconstructing for each channel the magnetic resonance signals collected in the combination mode which is switched by the image sequence controlling unit, and
comparing respectively a magnetic resonance signal reconstructed for each channel with a reference.

14. The apparatus according to claim 13, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

15. The apparatus according to claim 12, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b)the coil element, (c) the receiver, and (d) the combining unit combining the magnetic resonance signals, based on the simulated signal generated by the simulated signal generating unit.

16. The apparatus according to claim 12, further comprising:
an abnormal imaging-plan identifying unit that identifies an imaging plan using the abnormal combination mode identified by the abnormality identifying unit; and
a warning outputting unit that outputs a warning for the imaging plan identified by the abnormal imaging-plan identifying unit.

17. The apparatus according to claim 1, wherein the abnormality identifying unit identifies an abnormal combination mode by:
reconstructing for each channel the magnetic resonance signals collected in the combination mode which is switched by the image sequence controlling unit, and
comparing respectively a magnetic resonance signal reconstructed for each channel with a reference.

18. The apparatus according to claim 17, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

19. The apparatus according to claim 17, further comprising:
an abnormal imaging-plan identifying unit that identifies an imaging plan using the abnormal combination mode identified by the abnormality identifying unit; and
a warning outputting unit that outputs a warning for the imaging plan identified by the abnormal imaging-plan identifying unit.

20. The apparatus according to claim 1, further comprising:
a simulated signal generating unit that generates a simulated signal simulating the magnetic resonance signal;
wherein the abnormality identifying unit collects the magnetic resonance signals identifying the abnormality in at least any of (a) the combination mode, (b) the coil element, (c) the receiver, and (d) the combining unit combining the magnetic resonance signals, based on the simulated signal generated by the simulated signal generating unit.

21. The apparatus according to claim 1, further comprising:
an abnormal imaging-plan identifying unit that identifies an imaging plan using the abnormal combination mode identified by the abnormality identifying unit; and
a warning outputting unit that outputs a warning for the imaging plan identified by the abnormal imaging-plan identifying unit.

22. The apparatus according to claim 21, further comprising:
an alternative plan generating unit that generates an alternative plan for the imaging plan for which the warning is outputted by the warning outputting unit.

23. A magnetic-resonance imaging maintenance apparatus comprising:
an acquiring unit that acquires magnetic resonance signals for each combination mode collected by a magnetic resonance imaging apparatus by switching among a plurality of combination modes during a single imaging sequence, the magnetic resonance imaging apparatus having a plurality of composite combination modes of magnetic resonance signals detected by a plurality of coil elements; and
an abnormality identifying unit that identifies an abnormality in at feast any of (a) the combination mode, (b) the coil element, (c) the receiver, and (d) a combining unit combining the magnetic resonance signals, based on the magnetic resonance signals for each combination mode acquired by the acquiring unit.

24. A magnetic-resonance imaging maintenance system comprising:
a magnetic resonance imaging apparatus including
an applying unit that applies an imaging sequence including gradient magnetic fields and radio-frequency pulses to a patient placed within a static magnetic field,
a radio-frequency coil having a plurality of coil elements each of which detects magnetic resonance signals emitted from the patient during said imaging sequence depending on the application of the gradient magnetic fields and the radio-frequency pulses,
a plurality of receivers each of which receives a magnetic resonance signal and processes the received magnetic resonance signal,
a signal selecting circuit that combines magnetic resonance signals from the plurality of coil elements and inputs a combined magnetic resonance signal to each of the plurality of the receivers, the signal selecting circuit having a plurality of composite combination modes for the magnetic resonance signals,
an image sequence controlling unit that switches among a plurality of combination modes during a single said imaging sequence, and collects the magnetic resonance signals for each combination mode; and
a magnetic-resonance imaging maintenance apparatus including
an acquiring unit that acquires magnetic resonance signals for each combination mode collected by the magnetic resonance imaging apparatus by switching among a plurality of combination modes, and
an abnormality identifying unit that identifies an abnormality in at least any of (a) the combination mode, (b)

the coil element, (c) the receiver, and (d) a combining unit combining the magnetic resonance signals, based on the magnetic resonance signals for each combination mode acquired by the acquiring unit.

25. A magnetic resonance imaging method comprising:

acquiring magnetic resonance signals for each combination mode collected by a magnetic resonance imaging apparatus by switching among a plurality of combination modes during a single imaging sequence, the magnetic resonance imaging apparatus having a plurality of composite combination modes of magnetic resonance signals detected by a plurality of coil elements;

identifying an abnormality in at least any of (a) the combination mode, (b) the coil element, (c) the receiver, and (d) a combining unit combining the magnetic resonance signals, based on the magnetic resonance signals for the plurality of the combination modes; and displaying the identified abnormality.

* * * * *